United States Patent [19]
Digoy

[11] 3,978,511

[45] Aug. 31, 1976

[54] SEMICONDUCTOR DIODE AND METHOD OF MANUFACTURING SAME

[75] Inventor: Jean-Louis Digoy, Caen, France

[73] Assignee: U.S. Philips Corporation, New York, N.Y.

[22] Filed: July 22, 1974

[21] Appl. No.: 490,409

Related U.S. Application Data

[63] Continuation of Ser. No. 381,015, July 20, 1973, abandoned.

[52] U.S. Cl................................. 357/30; 357/52; 357/89
[51] Int. Cl.². ....................................... H01L 27/14
[58] Field of Search........................... 357/52, 30, 89

[56] References Cited
UNITED STATES PATENTS 3,226,614  12/1965  Haenichen......................... 317/234

Primary Examiner—Martin H. Edlow
Attorney, Agent, or Firm—Frank R. Trifari; Leon Nigohosian

[57] ABSTRACT

A diode comprising a semiconductor body including at least first and second adjoining regions of the same conductivity type. The first region includes the diode junction and has a high resistivity, while the second region has a high impurity concentration that varies gradually and increases with increasing distance from the interface between the first and the second regions. The second region comprises two adjoining zones, the zone removed from the first region being more highly doped than the zone proximate said region.

The method of manufacturing the above-described diode.

5 Claims, 5 Drawing Figures

SEMICONDUCTOR DIODE AND METHOD OF MANUFACTURING SAME

This is a continuation of application Ser. No. 381,015, filed July 20, 1973.

BACKGROUND OF THE INVENTION

The present invention relates to a semiconductor diode and particularly to one comprising a semiconductor body including at least two adjoining regions of the same conductivity type and of different resistivities.

Known photoelectric detectors comprise, in addition to photo-multipliers having a high degree of linearity and photodiodes with high current, photo-multipliers of which the part where multiplication occurs constitutes a diode or photo-counter which is usually manufactured from semiconductor material.

One of the required properties of a semiconductor diode for this application is a linear response within a wide range, in particular with a high current level. As is known, one of the important characteristic features in this respect is the value of the capacitance of the depletion zone formed at the photosensitive junction when polarized in the reverse direction. The capacitance of the depletion zone plays a part in determining the time constant (which must remain constant within a voltage range which is as large as possible) and remains substantially constant dependent upon the voltage difference between the depletion voltage and the breakdown voltage. In order to obtain a linear response in a wide range, the breakdown voltage must thus have a high value, whereas the value of the depletion voltage must be as low as possible.

The prior art includes diodes comprising a silicon substrate and obtained by inverted epitaxy which consists of depositing a thick, highly-doped epitaxial layer of a given conductivity type on a high purity monocrystalline substrate that has the same conductivity type, but a high resistivity (the epitaxial layer providing good mechanical rigidity), after which the thickness of the substrate is reduced. The diode is then formed by diffusing impurities of the opposite conductivity type into the remaining part of the substrate. Diodes obtained by this method exhibit drawbacks, mainly in that a very large concentration gradient is formed at the interface between the substrate and the epitaxial layer so that the breakdown voltage cannot assume a high value. In addition, the treatments of the substrate surface prior to depositing the epitaxial layer may give rise to interference of the crystal lattice of the epitaxial layer and the resulting irregularities of the crystal may involve a reduction of the breakdown voltage.

German Offenlegungsschrift 1,806,624, to which corresponds U.S. Pat. No. 3,534,231, issued Oct. 13, 1970, to J. R. Biard, discloses a semiconductor photo-detector which constitutes three semiconductor layers located one on the other, the first two layers constituting the photosensitive junction and the highly doped third layer being present at a distance from the photosensitive junction which is smaller than a diffusion length of the minority charge carriers. The photodetector structure disclosed there is said to reduce leakage currents resulting from the occurrence of minority charge carriers, by providing below the photosensitive junction, a barrier layer, for example, in the form of a reverse biased second junction. The value of the breakdown voltage is of no significance in the structure there and the three layers of such structure can thus be obtained by conventional means without special precautions, with the exception that the distance between the first and the third layers must be smaller than the diffusion length of the minority charge carriers.

In contrast with the Biard disclosure, the present invention provides a diode exhibiting a considerable increase in breakdown voltage. The present invention, furthermore, reduces the drawbacks mentioned above with respect to inverted epitaxy.

DESCRIPTION OF THE INVENTION

A semiconductor diode produced according to the present invention comprises a semiconductor body which comprises at least two adjoining regions of the same conductivity type. A first region, which comprises the diode junction, shows a high resistivity and the second region is highly doped. The impurity concentration of the second region exhibits a gradient that increases with increasing distance from the interface between the first and the second regions. The second region comprises two adjoining zones, the zone remote from the first region having a higher impurity doping than the zone adjoining the first region. The impurity concentration gradient in the second region favorably influences the behavior of the device with reverse voltage. In one embodiment of the invention, the thickness between the diode junction and the surface of the second region remote from the first region preferably is larger than the diffusion length of the minority charge carriers. In another embodiment, the thickness of the highly doped second region exceeds the diffusion length of the minority charge carriers so that recombination therein is possible. In a further embodiment, the thicknesses of the said first and second regions preferably are substantially the same.

In producing a diode according to an embodiment of the invention, impurities are diffused into a semiconductor body or substrate of high resistivity, with at least one diffusion of a high concentration of impurities of the same conductivity type as that of the body being carried out from at least one surface of the body and the reduction in thickness of the remaining body part that is not subjected to the diffusion. The remaining part of the body forms the first region and the diffused region forms the second region of the diode. The second region may serve as a mechanical support for the said diode. The concentration of impurities diffused into the semiconductor material varies gradually, thereby improving the reverse bias behavior of the diode.

The advantages of the diodes obtained by the present invention are ascribed to the reduction of the thickness of the semiconductor layer of high resistivity which involves a low depletion voltage (approximately 50 volt), an increase of the breakdown voltage which may reach a value of 1000 volts, a decrease of the series resistance of the body and thus a reduction of the time constant of the diode and hence also of the switching on and off times, and, finally, small variation of the capacitance in a wide voltage range at high intensities.

DESCRIPTION OF PREFERRED EMBODIMENTS

Figure 1:
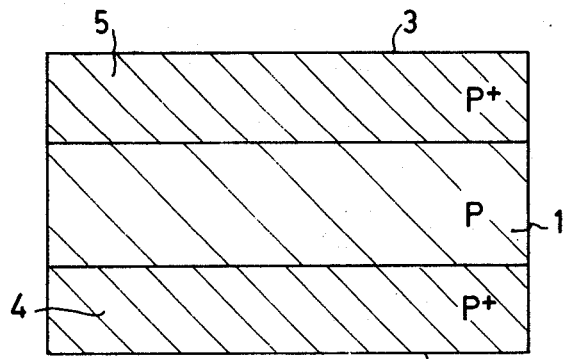
FIGS. 1 to 3 show various stages of the manufacture of a diode according to the invention.

The example to be described hereinafter relates to a diode which is obtained by means of a substrate of $p$ type conductivity, but it will be obvious that, according to the invention, diodes can also be obtained using an $n$ type substrate. In this latter case, i.e., with $n$ type substrate, all the conductivity types to be mentioned hereinafter would be reversed. It is, furthermore, to be noted that the dimensions in the drawing are strongly exaggerated and are not drawn to scale for clarity.

The oxide layer occurring at the surfaces as a result of the various thermal treatments are not shown. Protection layers are not mentioned in the description, since the formation of said layers and the provision of windows in the desirable places are carried out according to known methods, prior to the diffusion treatments.

Not mentioned either are pre-diffusions of the impurities which are to be diffused, since the diffusion treatments, if not stated to the contrary, are usually preceded by a pre-diffusion or the provision of a doped film or layer of paint.

Figure 2:
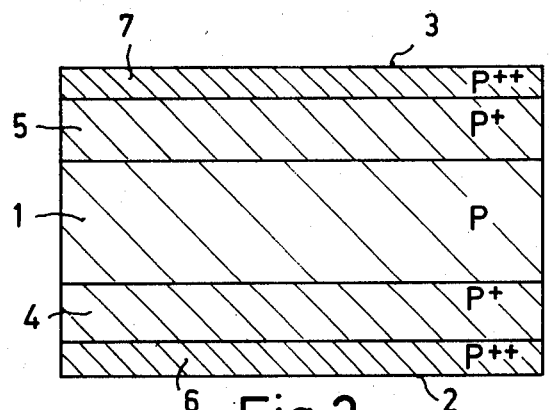
Figure 3:
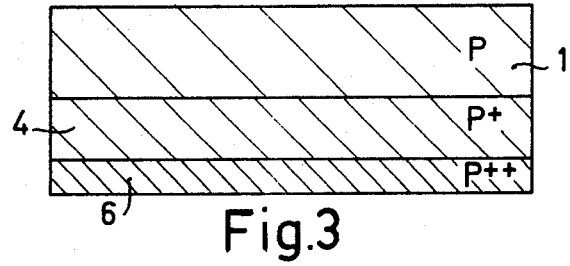

A diode (FIG. 4) is manufactured according to the invention (the steps being illustrated in FIGS. 1 through 3) beginning with $p$ type silicon substrate 1 (FIG. 1) having a high resistivity. At the two main surfaces 2 and 3 of the substrate 1, a first diffusion of a $p$ type impurity, for example, boron, in a comparatively high concentration is carried out, as a result of which $p+$ type regions 4 and 5 (FIG. 1) are obtained.

The diffusion depth, i.e. the thickness of the regions 4 and 5, is related to the breakdown voltage desirable for the diode and must be determined while observing the ionization voltage of the material of the substrate 1.

Since the diodes produced according to the invention are capable of high voltages, the minimum thickness of the remaining substrate part, i.e., the first region, must moreover be such that the ionization voltage of the substrate material is not reached. The thickness between the junction and the contact preferably is considerably larger than the diffusion length of the minority charge carriers, for example, on the order of at least $30/\mu m$ in the case of a silicon substrate. If a breakdown voltage on the order of 1000 volts is desirable, it is of advantage to provide in the silicon substrate a diffusion region with a thickness of at least $50/\mu m$. The thickness of the original substrate and the diffusion depth of the impurities are preferably chosen to be such that the thickness of the remaining part of the substrate in the ultimate device is equal to the thickness of the diffused highly doped region.

In carrying out a diffusion from the surface of a substrate, the impurities adjoining the surface are apt to diffuse in the substrate in the course of time, particularly towards the end of the diffusion treatment so that there occurs a surface depletion of doping impurities and thus an irregular variation of the concentration. Carrying out a second diffusion down to a smaller depth than the first, but with a higher doping concentration, enables this phenomenon to be avoided.

The highly doped second region is advantageously obtained by a process including two successive diffusions as described above, the impurity concentration and the depth of the second diffusion being higher and smaller, respectively, than those of the first diffusion. Such a second diffusion of the same conductivity type, but with a higher doping concentration of the impurity, is carried out down to a smaller depth, again via the surfaces 2 and 3 of the substrate 1, as a result of which the zones 6 and 7 (FIG. 2) of $p++$ type conductivity are obtained.

The highly doped second region can be obtained by diffusion of impurities via a single surface of the substrate, in which case the thickness of the substrate can be reduced from the surface opposite to the surface from which such diffusion took place. This method has the advantage that it is simple and comparatively inexpensive, in particular when the diffusion treatments are not carried out according to the conventional method but by the transfer of the impurities from a film or layer of doped material previously provided on the substrate.

In a preferred embodiment of the invention, however, the second region is produced by carrying out at least one diffusion with a high concentration of impurities, through each of the oppositely located main surfaces of the body or substrate down to a depth which preferably is at least equal to one diffusion length of the minority charge carriers, so that the initial thickness of the substrate is reduced at each of the two main surfaces from which diffusion took place, by the depth of diffusion. This embodiment has the advantage that there can be avoided stresses in the crystal during the diffusion thermal treatments.

By mechanical grinding and/or chemical etching, the regions diffused from one of the surfaces of the substrate, for example, the regions 5 and 7, are then removed. In order to ensure that all the impurities diffused via this one surface e.g., surface 3, are removed, the part of the $p$ type substrate 1 present in the proximity of the removed regions, i.e., regions 5 and 7, is also removed. The thickness of the remaining substrate 1 then is preferably substantially equal to the sum of the thickness of the zones 4 and 6.

From the new outer surface 8 (FIG. 4) of the substrate 1 which is located opposite the layer 6 and has previously been polished and cleaned, $n$ type impurities, for example, arsenic or phosphorus, are diffused into the substrate according to conventional methods, to form two zones 9 and 10, the former of which, i.e., zone 9, constitutes the photosensitive junction J together with the substrate 1 and the latter of which, i.e., zone 10, constitutes a guard ring which surrounds the zone 9 and serves to reduce the leakage currents and increase the breakdown voltage.

Contacts (not shown) are then provided on the surface 11 of the layer 6 and on the zones 9 and 10, respectively.

Figure 4:
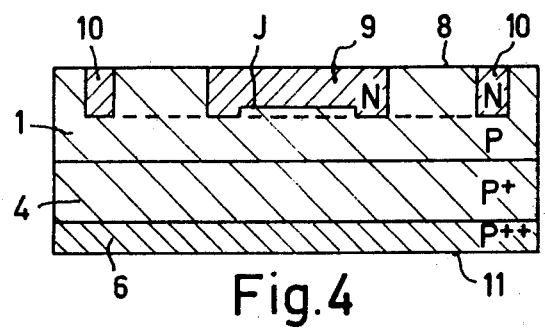
FIG. 4 and 5 are diagrammatic sectional view of two variations of a diode produced according to the invention.
Figure 5:
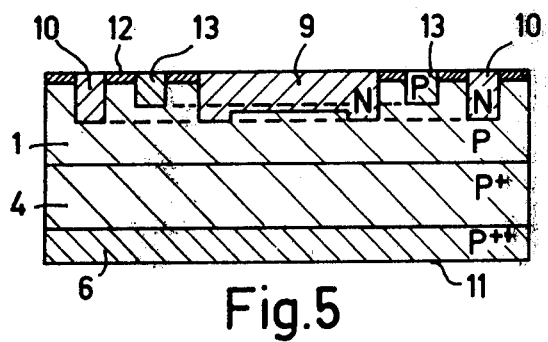

FIG. 5 shows another embodiment of the invention, wherein the components of the diode corresponding to those of the diode shown in FIG. 4 are referred to by the same reference numerals. As in the preceding example, the diode comprises a plate having three successive regions 1, 4, 6 of the $p$, $p+$ and $p++$ type, respectively, obtained according to the above described method. The zone 9 which constitutes the junction J together with the region 1 and the zone 10 which constitutes the guard ring are diffused in the layer 1.

During the various thermal treatments of the diffusion processes an inversion layer 12, which forms a short-circuit between the zones 9 and 10, may be formed on the outer surface 8 of the layer 1. In order to avoid this short-circuit, a further annular channel stopper zone 13 of the $p$-conductivity type is diffused locally between the zones 9 and 10, which zone 13 surrounds the zone 9 and thus cuts off the possibly formed inversion layer 12. The impurity concentration of the zone 13 must be higher than that of the layer 1.

What is claimed is:

1. A diode comprising a semiconductor body having at least first and second adjoining regions of the same conductivity type, said first region containing a portion of a second conductivity type so as to provide a diode junction within the first region, said first region having a high resistivity and the second region having a high doping impurity concentration, said second region exhibiting a doping impurity concentration increasing with increasing distance from the interface between said first and second regions, said second region comprising first and second adjoining zones, the first zone adjoining said first region and having a higher doping impurity concentration than said first region and the second zone being remote from said first region, said second zone having a higher doping impurity concentration than said first zone, wherein the thicknesses of said first and second regions are substantially equal.

2. A diode comprising a semiconductor body having at least first and second adjoining regions of the same conductivity type, said first region containing a portion of a second conductivity type so as to provide a diode junction within the first region, said first region having a high resistivity and the second region having a high doping impurity concentration, said second region exhibiting a doping impurity concentration increasing with increasing distance from the interface between said first and second regions, said second region comprising first and second adjoining zones, the first zone adjoining said first region and having a higher doping impurity concentration than said first region and the second zone being remote from said first region, said second zone having a higher doping impurity concentration than said first zone, wherein said portion is a surface zone and said diode further comprising a guard ring, both said surface zone and said guard ring having a conductivity type opposite to that of said regions, said zone being located in said first region to form said diode junction with said first region and being surrounded by said guard ring, said first region further comprising a further ring zone having the same conductivity type as said first region and a lower resistivity than said first region, said ring zone being disposed between said surface zone and said guard ring, said surface, guard ring, and further ring zone being spaced from each other and located entirely within said first region.

3. A diode comprising a semiconductor body having at least first and second adjoining regions of the same conductivity type, said first region containing a portion of a second conductivity type so as to provide a diode junction within the first region, said first region having a high resistivity and the second region having a high doping impurity concentration, said second region exhibiting a doping impurity concentration increasing with increasing distance from the interface between said first and second regions, said second region comprising first and second adjoining zones, the first zone adjoining said first region and having a high doping impurity concentration than said first region and the second zone being remote from said first region, said second zone having a higher doping impurity concentration than said first zone, wherein said diode junction and the surface of said second region more remote from said diode junction define a diode portion having a thickness exceeding the diffusion length of the minority charge carriers of said second region.

4. A diode comprising a semiconductor body having at least first and second adjoining regions of the same conductivity type, said first region containing a portion of a second conductivity type so as to provide a diode junction within the first region, said first region having a high resistivity and the second region having a high doping impurity concentration, said second region exhibiting a doping impurity concentration increasing with increasing distance from the interface between said first and second regions, said second region comprising first and second adjoining zones, the first zone adjoining said first region and having a high doping impurity concentration than said first region and the second zone being remote from said first region, said second zone having a higher doping impurity concentration than said first zone, wherein said second region has a thickness exceeding the diffusion length of the minority charge carriers thereof.

5. A diode as defined in claim 3, wherein said first region is one of $p$ and $n$ type conductivities and said first and second zones are of the same conductivity type as said first region, said first zone being one of $p+$ and $n+$ type and said second zone being one of $p++$ and $n++$ type conductivities.

* * * * *

UNITED STATES PATENT OFFICE
CERTIFICATE OF CORRECTION

Patent No. 3,978,511  Dated August 31, 1976

Inventor(s) Jean Louis Digoy

It is certified that error appears in the above-identified patent and that said Letters Patent are hereby corrected as shown below:

In the Title Page, after Section [21], it should read:
---[30] Foreign Application Priority Date October 5, 1970
France 7035834---.

Column 1, line 5, after "1973" insert ---now abandoned.---

Signed and Sealed this

Fourth Day of January 1977

[SEAL]

Attest:

RUTH C. MASON
Attesting Officer

C. MARSHALL DANN
Commissioner of Patents and Trademarks